United States Patent
McCarthy et al.

(10) Patent No.: US 9,297,830 B2
(45) Date of Patent: Mar. 29, 2016

(54) CONNECTOR / CABLE ASSEMBLY

(71) Applicant: LTX-Credence Corporation, Norwood, MA (US)

(72) Inventors: Richard McCarthy, Raynham, MA (US); Christopher Joel Hannaford, Norwood, MA (US); Lisette J. Zarzalejo, San Jose, CA (US); Roger H. Therrien, Hanover, MA (US)

(73) Assignee: Xcerra Corporation, Boston, MA (US)

( * ) Notice: Subject to any disclaimer, the term of this patent is extended or adjusted under 35 U.S.C. 154(b) by 605 days.

(21) Appl. No.: 13/749,155

(22) Filed: Jan. 24, 2013

(65) Prior Publication Data

US 2014/0203833 A1    Jul. 24, 2014

(51) Int. Cl.
| | |
|---|---|
| *G01R 31/00* | (2006.01) |
| *G01R 1/04* | (2006.01) |
| *H01R 13/24* | (2006.01) |
| *G01R 1/067* | (2006.01) |
| *H01R 12/71* | (2011.01) |
| *H01R 12/73* | (2011.01) |

(52) U.S. Cl.
CPC .......... *G01R 1/0416* (2013.01); *H01R 13/2421* (2013.01); *G01R 1/06722* (2013.01); *G01R 1/06777* (2013.01); *H01R 12/714* (2013.01); *H01R 12/73* (2013.01); *H01R 2201/20* (2013.01)

(58) Field of Classification Search
CPC ............. G01R 1/0416; G01R 1/06722; G01R 1/06777; H01R 13/2421; H01R 2201/20; H01R 12/714; H01R 12/73
USPC ........................................ 324/756.02, 756.03
See application file for complete search history.

(56) References Cited

U.S. PATENT DOCUMENTS

2002/0098728 A1*  7/2002  Kedrowski ......... H01R 13/6315
                                                                    439/131

* cited by examiner

*Primary Examiner* — Daniel Miller
(74) *Attorney, Agent, or Firm* — Brian J. Colandreo; Michael T. Abramson; Holland & Knight LLP

(57) ABSTRACT

A high voltage connector assembly includes a plurality of pin assemblies, each of the plurality of pin assemblies having a first end and a second end. The first end of each of the plurality of pin assemblies is configured to releasably electrically engage a load board. A plurality of pin pads, wherein the second end of each of the plurality of pin assemblies is configured to electrically engage a pin pad included within the plurality of pin pads. A plurality of connector pads are electrically coupled to the plurality of pin pads, wherein each of the plurality of connector pads is configured to be electrically coupled to a wire-based conductor included within a plurality of wire-based conductors. A potting compound is configured to encapsulate the plurality of connector pads.

15 Claims, 3 Drawing Sheets

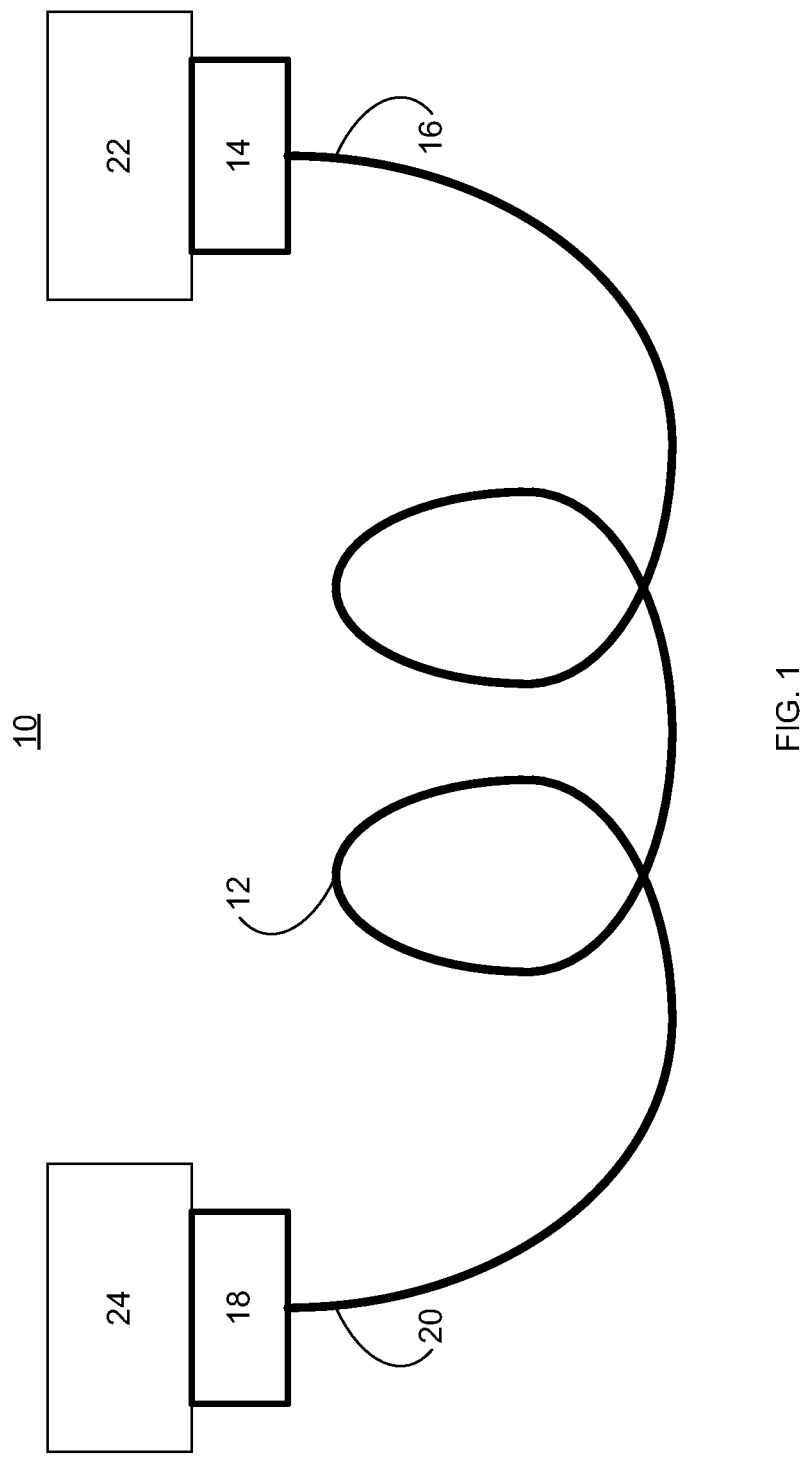

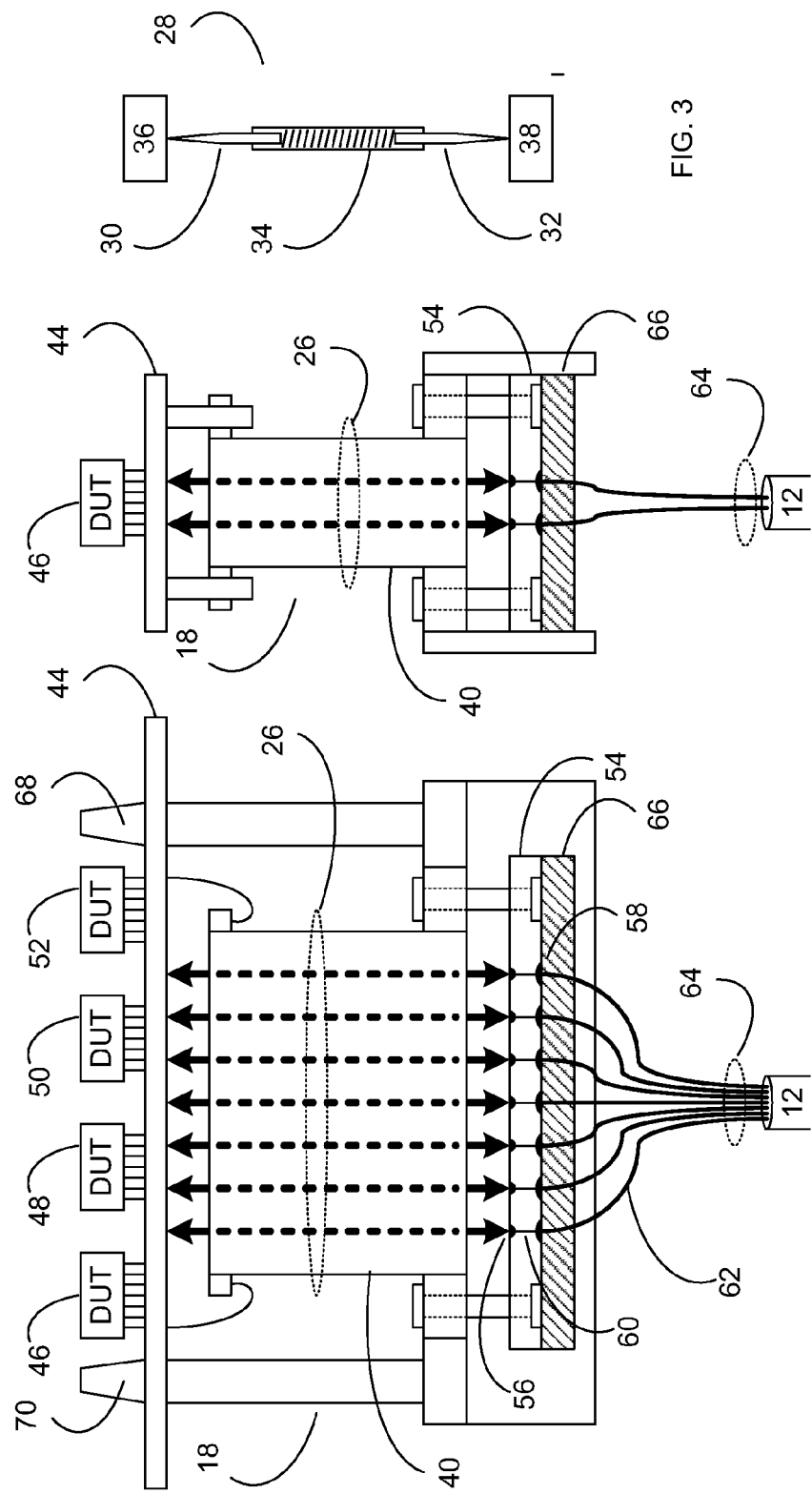

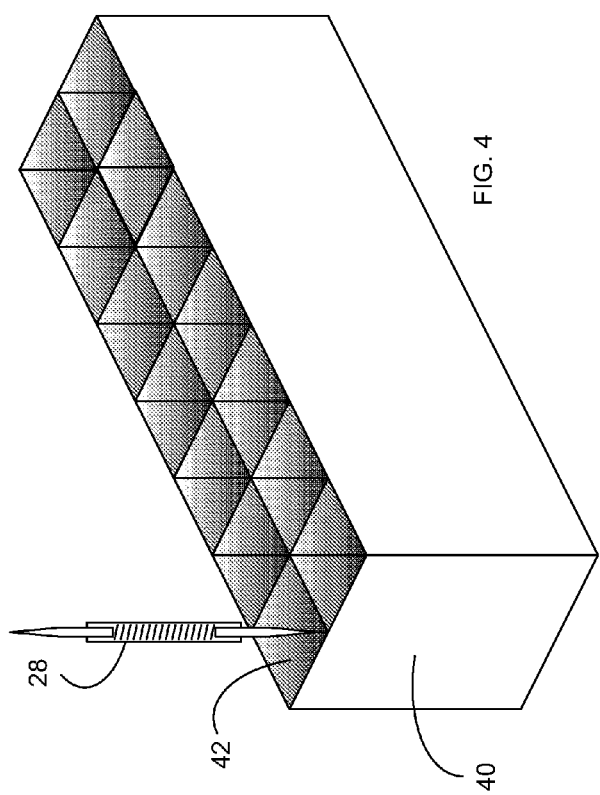
FIG. 4
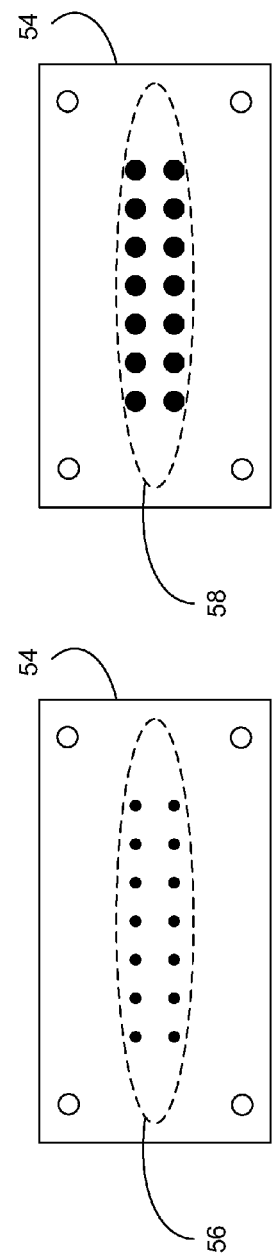
FIG. 5A (top view)
FIG. 5B (bottom view)

CONNECTOR / CABLE ASSEMBLY

TECHNICAL FIELD

This disclosure relates to electrical connectors and, more particularly, to electrical connectors for use with high-voltage signals.

BACKGROUND

Electrical connections between subassemblies may be achieved using standard electrical connectors, such as a molded housing that includes male/female connectors that are configured to mate with corresponding female/male connector. In such an interconnection scheme, a printed circuit assembly (PCA) may be populated with connectors that are configured to mate with a connector assembly on a cable.

The above-described high-voltage type of interconnections system has performance/cost limitations when used with Automatic Testing Equipment (ATE), as such connections tend to be bulky and expensive.

SUMMARY OF DISCLOSURE

In one implementation, a high voltage connector assembly includes a plurality of pin assemblies, each of the plurality of pin assemblies having a first end and a second end. The first end of each of the plurality of pin assemblies is configured to releasably electrically engage a load board. A plurality of pin pads, wherein the second end of each of the plurality of pin assemblies is configured to electrically engage a pin pad included within the plurality of pin pads. A plurality of connector pads are electrically coupled to the plurality of pin pads, wherein each of the plurality of connector pads is configured to be electrically coupled to a wire-based conductor included within a plurality of wire-based conductors. A potting compound is configured to encapsulate the plurality of connector pads.

One or more of the following features may be included. The load board may be configured to releasable engage one or more devices under test (DUTs). The pin assemblies may be pogo pin assemblies. The plurality of pin pads and the plurality of connector pads may be included on a connector circuit board. The plurality of pin pads and the plurality of connector pads may be positioned on opposite sides of the connector circuit board. The wire-based conductor may be soldered to a connector pad included within the plurality of connector pads. The plurality of wire-based conductors may be included within a multi-conductor cable assembly. A pin alignment structure may be configured to position the plurality of pin assemblies with respect to each other.

In another implementation, a high voltage connector assembly includes a plurality of pogo pin assemblies, each of the plurality of pin assemblies having a first end and a second end. The first end of each of the plurality of pin assemblies is configured to releasably electrically engage a load board that is configured to releasable engage one or more devices under test (DUTs). A plurality of pin pads, wherein the second end of each of the plurality of pin assemblies is configured to electrically engage a pin pad included within the plurality of pin pads. A plurality of connector pads are electrically coupled to the plurality of pin pads. Each of the plurality of connector pads is configured to be electrically coupled to a wire-based conductor included within a plurality of wire-based conductors. A potting compound is configured to encapsulate the plurality of connector pads.

One or more of the following features may be included. The plurality of pin pads and the plurality of connector pads may be included on a connector circuit board. The plurality of pin pads and the plurality of connector pads may be positioned on opposite sides of the connector circuit board. The wire-based conductor may be soldered to a connector pad included within the plurality of connector pads. The plurality of wire-based conductors may be included within a multi-conductor cable assembly. A pin alignment structure may be configured to position the plurality of pin assemblies with respect to each other.

In another implementation, a high voltage cable assembly includes a multi-conductor cable assembly, a PCB connector assembly coupled to a first end of the multi-conductor cable assembly, and a high voltage connector assembly coupled to a second end of the multi-conductor cable assembly. The high voltage connector assembly includes a plurality of pin assemblies, each of the plurality of pin assemblies having a first end and a second end. The first end of each of the plurality of pin assemblies is configured to releasably electrically engage a load board. A plurality of pin pads, wherein the second end of each of the plurality of pin assemblies is configured to electrically engage a pin pad included within the plurality of pin pads. A plurality of connector pads are electrically coupled to the plurality of pin pads, wherein each of the plurality of connector pads is configured to be electrically coupled to a wire-based conductor included within the multi-conductor cable assembly. A potting compound is configured to encapsulate the plurality of connector pads.

One or more of the following features may be included. The load board may be configured to releasable engage one or more devices under test (DUTs). The pin assemblies may be pogo pin assemblies. The plurality of pin pads and the plurality of connector pads may be included on a connector circuit board. The plurality of pin pads and the plurality of connector pads may be positioned on opposite sides of the connector circuit board. The wire-based conductor may be soldered to a connector pad included within the plurality of connector pads. A pin alignment structure may be configured to position the plurality of pin assemblies with respect to each other.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a diagrammatic view of a high voltage cable assembly;

FIGS. 2A & 2B are diagrammatic views of a high voltage connector assembly included within the high voltage cable assembly of FIG. 1;

FIG. 3 is a diagrammatic view of a pin assembly included within the high voltage connector assembly of FIGS. 2A & 2B;

FIG. 4 is an isometric view of a pin alignment structure included within the high voltage connector assembly of FIGS. 2A & 2B; and FIGS. 5A & 5B are diagrammatic views of a connector circuit board included within the high voltage connector assembly of FIGS. 2A & 2B.

Like reference symbols in the various drawings indicate like elements.

DETAILED DESCRIPTION OF THE PREFERRED EMBODIMENTS

Referring to FIG. 1, there is shown high voltage cable assembly 10 that may include multi-conductor cable assembly 12, PCB connector assembly 14 coupled to first end 16 of multi-conductor cable assembly 12, and high voltage connector assembly 18 coupled to a second end 20 of multi-conductor cable assembly 12. As will be discussed below in greater detail, high voltage cable assembly 10 may be configured to connect automated testing equipment 22 to components 24 that are being tested, and transmit high voltage signals (e.g., >1,000 volts) therebetween.

Referring also to FIGS. 2A, 2B & 3, high voltage connector assembly 18 may include plurality of pin assemblies 26. An example of the individual pin assemblies (e.g., pin assembly 28) included within plurality of pin assemblies 26 may include but is not limited to pogo pin assemblies. As is known in the art, a pogo pin assembly is a device used in electronics/electrical circuits to establish a connection (typically a temporary connection) between two electrical circuits (e.g., printed circuit boards). Another example of the individual pin assemblies (e.g., pin assembly 28) included within plurality of pin assemblies 26 may include but is not limited to a low profile, elastomeric pin assembly that incorporate a resilient material to bias distal ends of pin assembly 28 with respect to each other.

Each of the plurality of pin assemblies 26 (e.g., pin assembly 28) may include first end 30 and second end 32. Pin assembly 28 may also include spring-loaded cylinder 34, which may bias first end 30 and second end 32 away from each other. When compressed between two electrical circuits (circuits 36, 38), first end 30 and second end 32 at each end of pin assembly 28 may establish (e.g., temporary) electrical connections with these two electrical circuits (circuits 36, 38 respectively), thereby temporarily electrically coupling circuits 36, 38.

High voltage connector assembly 18 may include pin alignment structure 40, which may be configured to position plurality of pin assemblies 26 with respect to each other. For example and as shown in FIG. 4, pin alignment structure 40 may be configured as a matrix that forms a plurality of channels (e.g., channel 42) into which a pin assembly (e.g., pin assembly 28) included within plurality of pin assemblies 26 is positioned.

The first end (e.g., first end 30) of each of plurality of pin assemblies 26 may be configured to releasably electrically engage load board 44. Load board 44 may be a printed circuit board and may be configured to releasable engage one or more devices under test (DUTs), such as DUTs 46, 48, 50, 52.

Referring also to FIGS. 5A & 5B, high voltage connector assembly 18 may further include connector circuit board 54, wherein connector circuit board 54 includes plurality of pin pads 56 that may be electrically coupled to plurality of connector pads 58. For example, plurality of pin pads 56 and plurality of connector pads 58 may be positioned on opposite sides of connector circuit board 54, wherein electrical conductors (e.g., conductor 60) may pass through connector circuit board 54 and may electrically couple related pairs of pin pads and connector pads. The second end (e.g., second end 32) of each of plurality of pin assemblies 26 may be configured to electrically engage a pin pad included within plurality of pin pads 56.

Pin alignment structure 40 may be configured so that plurality of pin assemblies 26 positioned within pin alignment structure 40 are properly spaced to ensure that e.g., plurality of pin pads 56 are positioned in such a manner to avoid any arcing/shorting or similar undesirable conditions during use of high voltage connector assembly 18.

Each of plurality of connector pads 58 may be configured to be electrically coupled to a wire-based conductor (e.g., wire 62) included within plurality of wire-based conductors 64 (e.g., which may be included within multi-conductor cable assembly 12). The wire-based conductor (e.g., wire 62) may be soldered to a connector pad included within plurality of connector pads 58. Accordingly and as shown in FIGS. 5A & 5B, each of the plurality of connector pads 58 included within connector circuit board 54 may be larger than each of the plurality of pin pads 56 included within connector circuit board 54. Accordingly, the spacing between adjacent connector pads may be smaller than the spacing between adjacent pin pads.

As discussed above, high voltage cable assembly 10 may be configured to connect automated testing equipment 22 to components 24 that are being tested, and may transmit high voltage signals therebetween. Accordingly, as the distance between adjacent connector pads decreases, the likelihood of signals arcing between adjacent connector pads increases. Accordingly, high voltage connector assembly 18 may include potting compound 66 that may be configured to encapsulate plurality of connector pads 58 (and possibly a portion of plurality of wire-based conductors 64), thus isolating/insulating adjacent connector pads from each other and reducing the likelihood of arcing therebetween.

One or more alignment pins (e.g., alignment pins 68, 70) may be utilized to align load board 44 and high voltage connector assembly 18. For example, alignment pins 68, 70 may be tapered alignment pins that are sized to fit within passages in load board 44, thus ensuring proper electrical connectivity with plurality of pin assemblies 26.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A high voltage connector assembly comprising:
a plurality of pin assemblies, each of the plurality of pin assemblies having a first end and a second end, wherein the first end of each of the plurality of pin assemblies is configured to releasably electrically engage a load board;
a plurality of pin pads disposed on a first surface of a connector circuit board, wherein the second end of each of the plurality of pin assemblies is configured to releasably electrically engage a corresponding one of the plurality of pin pads;
a plurality of connector pads disposed on a second surface of the connector circuit board, wherein each connector pad is aligned with and electrically coupled to a corresponding one of the plurality of pin pads through the connector circuit board, wherein each of the plurality of connector pads is configured to be directly electrically coupled to a corresponding one of a plurality of wire-based conductors of a multi-conductor cable assembly; and
a potting compound encapsulating the plurality of connector pads, wherein the potting compound electrically insulates a first connector pad of the plurality of connector pads from a second connector pad of the plurality of connector pads that is adjacent to the first connector pad.

2. The high voltage connector assembly of claim 1 wherein the load board is configured to releasably engage one or more devices under test (DUTs).

3. The high voltage connector assembly of claim 1 wherein the pin assemblies are pogo pin assemblies.

4. The high voltage connector assembly of claim 1 wherein the wire-based conductor is soldered to a connector pad included within the plurality of connector pads.

5. The high voltage connector assembly of claim 1 wherein the plurality of wire-based conductors are included within a multi-conductor cable assembly.

6. The high voltage connector assembly of claim 1 further comprising a pin alignment structure configured to position the plurality of pin assemblies with respect to each other.

7. A high voltage connector assembly comprising:
- a plurality of pogo pin assemblies, each of the plurality of pin assemblies having a first end and a second end, wherein the first end of each of the plurality of pin assemblies is configured to releasably electrically engage a load board that is configured to releasably engage one or more devices under test (DUTs);
- a plurality of pin pads disposed on a first surface of a connector circuit board, wherein the second end of each of the plurality of pin assemblies is configured to releasably electrically engage a corresponding one of the plurality of pin pads;
- a plurality of connector pads disposed on a second surface of the connector circuit board, wherein each connector pad is aligned with and electrically coupled to a corresponding one of the plurality of pin pads through the connector circuit board, wherein each of the plurality of connector pads is configured to be directly electrically coupled to a corresponding one of a plurality of wire-based conductors of a multi-conductor cable assembly; and
- a potting compound encapsulating the plurality of connector pads, wherein the potting compound electrically insulates a first connector pad of the plurality of connector pads from a second connector pad of the plurality of connector pads that is adjacent to the first connector pad.

8. The high voltage connector assembly of claim 7 wherein the wire-based conductor is soldered to a connector pad included within the plurality of connector pads.

9. The high voltage connector assembly of claim 7 wherein the plurality of wire-based conductors are included within a multi-conductor cable assembly.

10. The high voltage connector assembly of claim 7 further comprising a pin alignment structure configured to position the plurality of pin assemblies with respect to each other.

11. A high voltage cable assembly comprising:
- a multi-conductor cable assembly;
- a PCB connector assembly coupled to a first end of the multi-conductor cable assembly; and
- a high voltage connector assembly coupled to a second end of the multi-conductor cable assembly, the high voltage connector assembly including:
  - a plurality of pin assemblies, each of the plurality of pin assemblies having a first end and a second end, wherein the first end of each of the plurality of pin assemblies is configured to releasably electrically engage a load board;
  - a plurality of pin pads disposed on a first surface of a connector circuit board, wherein the second end of each of the plurality of pin assemblies is configured to releasably electrically engage a corresponding one of the plurality of pin pads;
  - a plurality of connector pads disposed on a second surface of the connector circuit board, wherein each connector pad is aligned with and electrically coupled to a corresponding one of the plurality of pin pads through the connector circuit board, wherein each of the plurality of connector pads is directly electrically coupled to a corresponding one of a plurality of wire-based conductors included within the multi-conductor cable assembly; and
  - a potting compound encapsulating the plurality of connector pads, wherein the potting compound electrically insulates a first connector pad of the plurality of connector pads from a second connector pad of the plurality of connector pads that is adjacent to the first connector pad.

12. The high voltage cable assembly of claim 11 wherein the load board is configured to releasably engage one or more devices under test (DUTs).

13. The high voltage cable assembly of claim 11 wherein the pin assemblies are pogo pin assemblies.

14. The high voltage cable assembly of claim 11 wherein the wire-based conductor is soldered to a connector pad included within the plurality of connector pads.

15. The high voltage cable assembly of claim 11 further comprising a pin alignment structure configured to position the plurality of pin assemblies with respect to each other.

* * * * *